United States Patent [19]
Guthrie et al.

[11] Patent Number: 5,633,195
[45] Date of Patent: May 27, 1997

[54] LASER PLANARIZATION OF ZONE 1 DEPOSITED METAL FILMS FOR SUBMICRON METAL INTERCONNECTS

[75] Inventors: William L. Guthrie, Hopewell Junction; Naftali E. Lustig, Croton on Hudson, both of N.Y.

[73] Assignee: International Business Machines, Corp., Hopewell Junction, N.Y.

[21] Appl. No.: 532,376

[22] Filed: Sep. 22, 1995

Related U.S. Application Data

[63] Continuation of Ser. No. 298,681, Aug. 31, 1994, abandoned.

[51] Int. Cl.[6] .................................................. H01L 21/26
[52] U.S. Cl. ................... 438/662; 219/121.66; 438/665; 438/632
[58] Field of Search ........................ 437/173, 194, 437/245; 148/DIG. 90; 219/121.66, 121.67, 121.84; 204/192.17, 192.34

[56] References Cited

U.S. PATENT DOCUMENTS

| | | | |
|---|---|---|---|
| 4,094,764 | 6/1978 | Boucher et al. | 204/298.06 |
| 4,125,446 | 11/1978 | Hartsough et al. | 204/192.27 |
| 4,401,726 | 8/1983 | Gnanamuthu | 428/610 |
| 4,462,884 | 7/1984 | Gillery et al. | 204/192.28 |
| 4,681,795 | 7/1987 | Tuckerman | 428/209 |
| 4,758,533 | 7/1988 | Magee et al. | 437/173 |
| 4,814,578 | 3/1989 | Tuckerman | 219/121.65 |
| 4,900,581 | 2/1990 | Stuke et al. | 427/555 |
| 4,909,314 | 3/1990 | Lamoat, Jr. | 165/80.3 |
| 4,920,070 | 4/1990 | Mukai | 437/194 |
| 5,011,793 | 4/1991 | Obinata | 437/203 |
| 5,082,545 | 1/1992 | Tanaka et al. | 204/298.03 |
| 5,139,974 | 8/1992 | Sandhu et al. | 437/245 |
| 5,166,093 | 11/1992 | Grief | 437/173 |
| 5,232,674 | 8/1993 | Mukai et al. | 437/173 |
| 5,250,465 | 10/1993 | Iizuka et al. | 437/194 |

OTHER PUBLICATIONS

Bruce Banks, "Ion Beam Applications Research–©1981 Summary of Lewis Research Center Programs", NASA Technical Memorandum 81721, pp. 3 & 6, (1981).

Paper from International Conference on Metallurgica Coatings, San Francisco, CA "Optical Reflectance & Transmission . . . Surface", by Stephens et al., Mar. 1977.

Artical entitled "Thin Film Process", printed in Academic Press, 1978, by John L. Vossen, et al., of RCA Laboratories, pp. 105–107, Thornton et al.

*Primary Examiner*—John Niebling
*Assistant Examiner*—Thomas G. Bilodeau
*Attorney, Agent, or Firm*—Whitham, Curtis, Whitham & McGinn

[57] ABSTRACT

A method of laser planarizing metallic thin films minimizes the laser fluences required to melt or nearly melt the metalization. This is accomplished by reducing the optical reflectivity of the metallic lines and vias by using textured thin films. This reduction of optical reflectivity, in turn, reduces the minimum fluence needed to melt or nearly melt the metal using a laser, thus improving the process window and minimizing the damage to the surrounding media.

9 Claims, 3 Drawing Sheets ically absorbing metallic film. The molten metal is characterized
LASER PLANARIZATION OF ZONE 1 DEPOSITED METAL FILMS FOR SUBMICRON METAL INTERCONNECTS This is a continuation of application Ser. No. 08/298,681, filed Aug. 31, 1994 now abandoned.

BACKGROUND OF THE INVENTION

1. Field of the Invention

The present invention generally relates to the application of metallic thin films for integrated circuit chip wiring and, more particularly, to a method of laser planarization of the metallic films requiring lower laser fluences.

2. Description of the Prior Art

Pulsed laser planarization of metallic thin films for on-chip wiring, including filling of high aspect ratio vias, is currently being developed. The technique relies on a high power, very short laser pulse to rapidly melt an optically absorbing metallic film. The molten metal is characterized by high surface tension and low viscosity which allows it to fill deep vias and planarize its surface.

The pulsed laser planarization technique suffers from the fact that low resistivity metals of interest, such as aluminum and alloys of aluminum and copper, are characterized by a high reflectivity. Thus, higher laser fluences are required to melt or nearly melt metallic conductors such as aluminum and alloys of aluminum and copper. The use of high laser fluences is inefficient and has been found to result in a higher degree of ablation which leads to discontinuous metallic lines and partially filled vias. The process window for achieving good results is narrow, making this process difficult for use in future manufacturing. Also, higher laser fluences result in higher temperatures to the surrounding dielectric media. This is of concern for organic interlevel dielectrics such as polyimides which rapidly degrade above 500° C.

One effort to solve this problem has been to deposit an antireflection film, such as titanium, on aluminum lines prior to laser melting. The problem with this approach is that heating and melting the coated aluminum metallization by the laser beam causes the antireflection coating to intermix with the aluminum, resulting in contaminated high resistivity metallurgy.

SUMMARY OF THE INVENTION

It is therefore an object of the present invention to provide a method of laser planarization of the metallic films requiring lower laser fluences, thereby minimizing damage to surrounding media and improving the efficiency of the manufacturing process.

According to the invention, the optical reflectivity of the as-deposited metallic lines and vias is reduced by using morphologically textured thin films. This reduction of optical reflectivity, in turn, reduces the minimum fluence needed to melt or nearly melt the metal using a laser, thus improving the process window and minimizing the damage to the surrounding media. The invention is particularly useful in treating high reflectivity metals such as aluminum and alloys of aluminum and copper. Other high reflectivity metallic films, such as those of gold and silver, can also be similarly treated. While copper has a relatively low refectivity in the visible region, the invention can be advantageously used to treat copper to further reduce its reflectivity.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
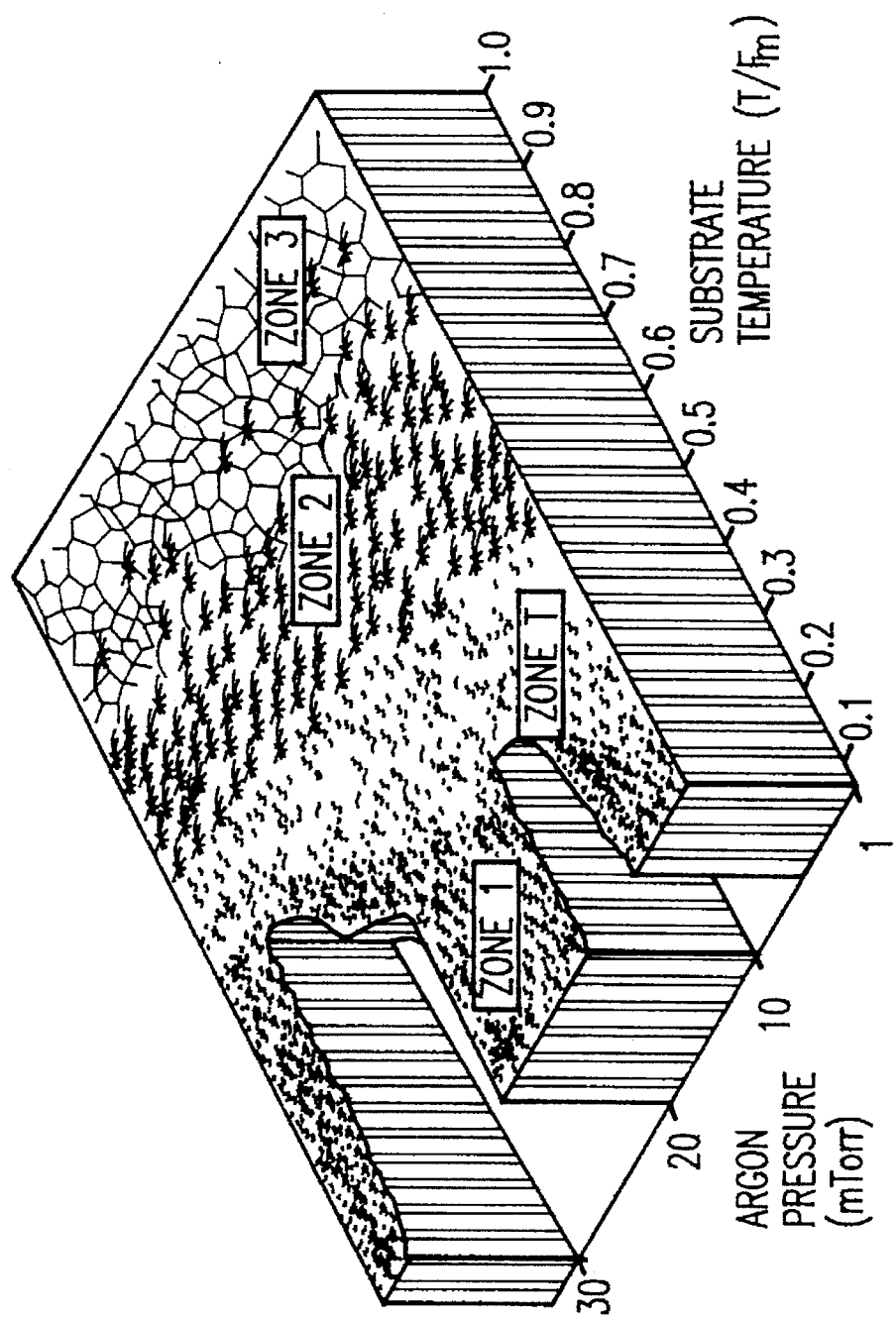
FIG. 1 is a "zone diagram" schematically showing the influence of substrate temperature and argon working pressure on the structure of metal coatings deposited by sputtering using cylindrical magnetron sources.

Referring now to the drawings, and more particularly to FIG. 1, there is shown a microstructural "zone diagram" for thin films deposited using glow discharge sputtering. This diagram relates the microstructure and morphology of vapor deposited thin films to the important deposition parameters of pressure and temperature. The two horizontal axes consist of the homologous temperature (substrate temperature T relative to the melting temperature of the films $T_m$, in absolute degrees), and the working gas pressure during deposition. For a detailed description of the zone diagram, see J. Thornton and A. Penfold in *Thin Film Processes* edited by J. Vossen and W. Kern, Academic Press, 1978.

Figure 2:
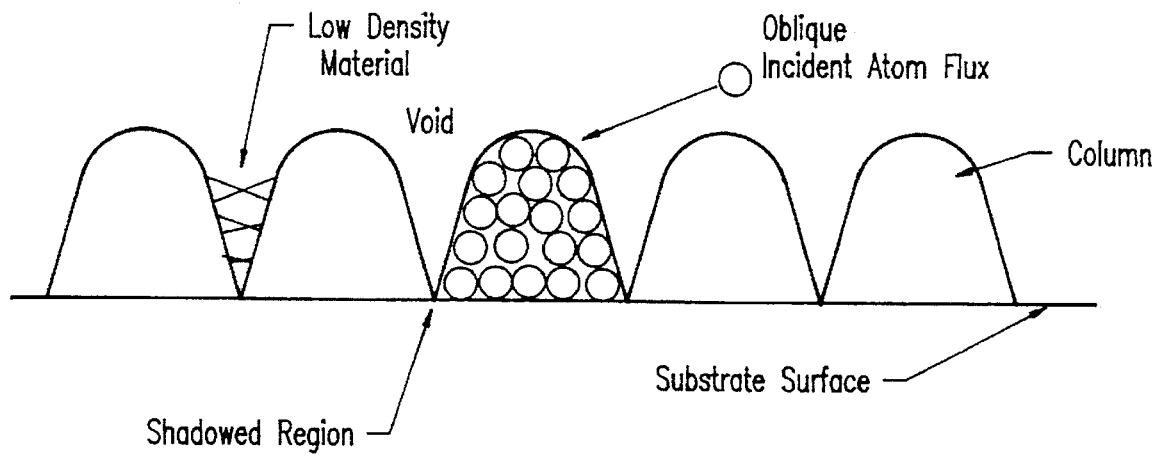
FIG. 2 is an enlarged schematic representation of the zone 1 structure shown in FIG. 1.

While typical interconnect metallization is deposited in the region between zone T to zone 3, of main interest here are films deposited under zone 1 conditions, of high pressure and low homologous temperature. Under these conditions, the resulting films generally have a columnar texture, or morphology. The films, as shown by the enlarged schematic representation of FIG. 2, consist of elongated columns which are separated by untilled spaces (voids) or by a less dense material. The individual columns are made up of tapered crystallites with nearly bulk density.

The occurrence of the zone 1 structure is due to a self-shadowing effect whereby incident atoms cannot reach certain areas on the growing film which are self-shadowed by atoms already on the substrate. This mechanism was first observed for evaporated films at high vacuum when the substrate was placed at an oblique angle relative to the incident vapor. In glow discharge sputtering, it occurs when a large fraction of the sputtered atoms arrive at oblique angles relative to the growing film and when the surface mobility of the atoms on the growing film is low. A high oblique incident component can be obtained by sputtering at high working gas pressures. The mean free path, L, in centimeters (cm) for a sputtered atom is given approximately by the formula $$L(\text{cm}) = \frac{5}{P(\text{mTorr})},$$

where P is the working gas pressure in milliTorrs (mTorr). For a typical working gas pressure of 5 mTorr, the mean free path is 1 cm. For a target-to-substrate distance of 2 cm, the sputtered atoms will suffer two collisions with the working gas atoms, losing a small fraction of its energy and traveling in a mostly line-of-sight path. For P=30 mTorr, L=0.16 cm and the incident atoms suffer approximately twelve collisions which tend to randomize the arrival angles at the growing film as well as thermalize the incident atom energy.

The second deposition parameter, low homologous temperature, reduces the surface mobility of the atoms and thus prevents smoothing out of the columns during growth. The reduced incident energy, discussed above, also results in less surface mobility and therefore higher sticking coefficients. Other factors which promote zone 1 growth and stability include impurity atoms in the working gas such as oxygen or nitrogen which adsorb onto the growing film and reduce adatom mobility. An initially rough substrate enhances the self-shadowing effect and a low ion bombardment of the surface during growth prevents the redistribution of arriving atoms and thus surface smoothing. This in-situ ion bombardment is minimized by maintaining a low substrate bias voltage relative to the plasma potential during the deposition.

Figure 3:
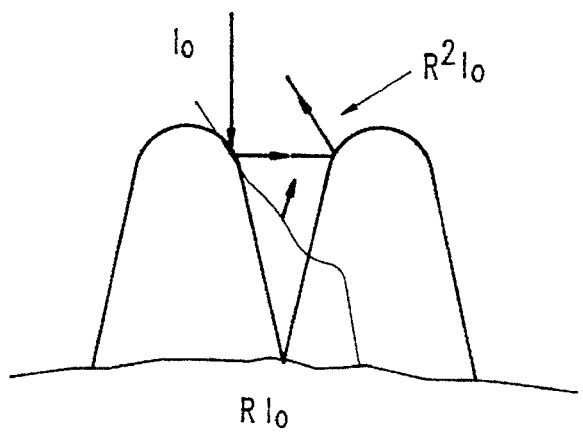
FIG. 3 is a schematic representation of a light beam incident on a film grown in zone 1 of the zone diagram, making two internal reflections before exiting.

The separation between columns in zone 1 can be on the order of the wavelength of visible light and thus affects the optical properties of the films. When the laser light wavelength used to melt the films is comparable to or smaller than the voids between columns, multiple reflections will occur and geometric optics considerations apply. This is illustrated in FIG. 3. The reflection coefficient R for a flat surface is defined by $$R = \frac{I}{IO},$$

where IO is the incident light intensity and I is the reflected light intensity. FIG. 3 shows a schematic of a ray incident on an open structure and making two reflections before escaping. The reflectivity for a smooth aluminum film is approximately 0.9, which will be reduced to 0.81 upon making the two reflections. The reflectance can also be reduced when the separation between columns is smaller than the wavelength of light. This occurs due to scattering rather than multiple internal reflections and can be described using a graded index of refraction model. See R. B. Stephens and C. D. Cody, *Thin Solid Films*, 19 45, 1977.

Figure 4:
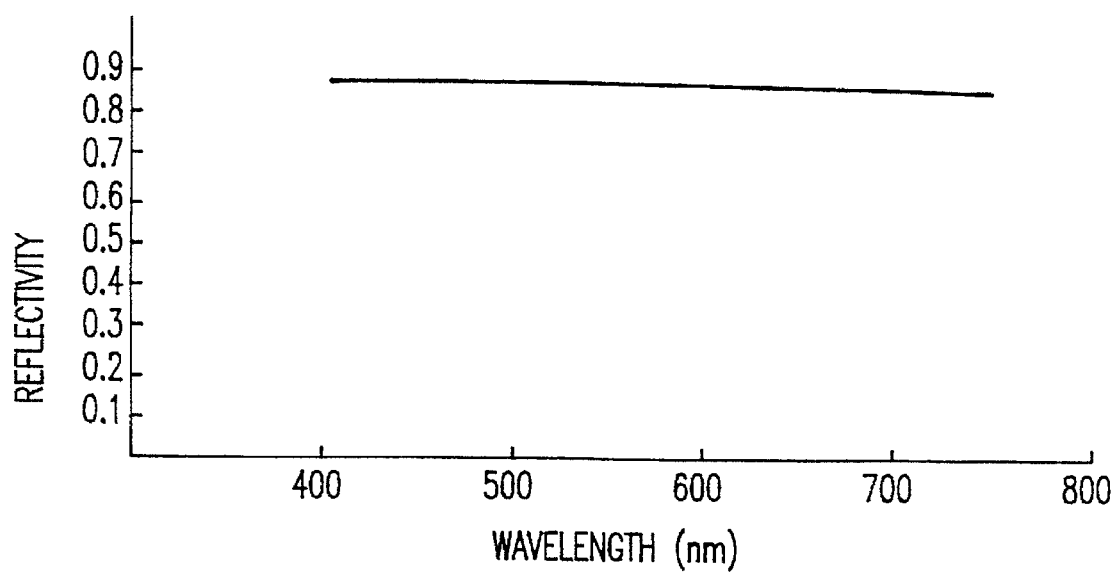
FIG. 4 is a graph showing the reflectivity of a mirror-like aluminum film deposited at 1 mTorr of argon.
Figure 5:
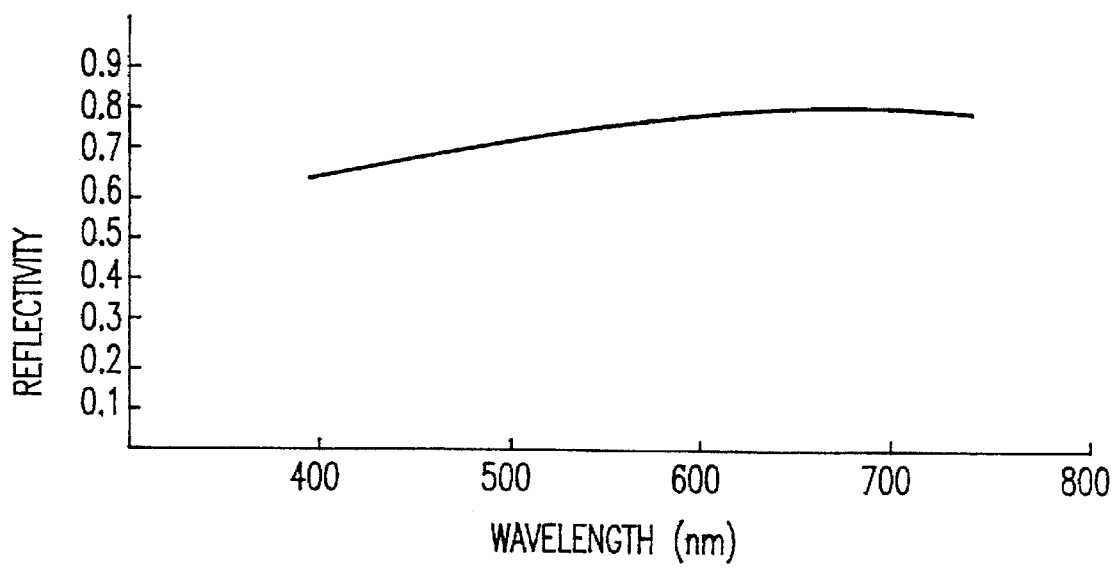
FIG. 5 is a graph showing the reflectivity of an aluminum film deposited at 30 mTorr of argon.

FIG. 4 shows the measured reflectance between 400 and 750 nanometers (nm) for an aluminum film deposited at 1 mTorr with a mirror-like surface morphology. FIG. 5 shows the effect of increasing the argon pressure to 30 mTorr on the reflectivity of the resulting films. The observed reduction in reflectance is most pronounced in the short wavelength portion of the spectrum, indicating that the spaces between columns is on the order of the wavelength of ultraviolet (UV) light. This suggests tailoring of the incident light spectrum to shorter wavelength in order to optimize the reflow process.

In summary, the reflectivity of sputtered aluminum, and similar high reflectance metallic films, can be modified by adjusting the gas pressure in the sputtering chamber. Films of reduced reflectivity are obtained when sputtering at high working gas pressures and low substrate temperatures; i.e., between 10 to 100 mTorr, rather than the usual 1 to 10 mTorr range typically used with magnetron-based systems, and temperatures low relative to the melting temperature of the film. The reduction in the optical reflectivity is due to the textured or columnar film morphology (zone 1 of the thin film "zone diagram" shown in FIG. 1) which develops during high pressure sputtering. The incident laser light rays are trapped in the regions between columns making a number of reflections before exiting. This increases the fraction of light absorbed by the metallic surface and reduces the overall surface reflectivity.

Other related methods for reducing the optical reflectivity of metallic surfaces by texturing include: (1) high pressure sputtering plus a light anisotropic etch to remove the less tightly bound material in between the columns, thereby increasing the aspect ratio (depth/width ratio) of the film morphology and enhancing the absorption of light, and (2) ion bombardment treatment of an initially smooth surface.

While the invention has been described in terms of a preferred embodiment and two alternative embodiments, those skilled in the art will recognize that the invention can be practiced with modification within the spirit and scope of the appended claims.

Having thus described our invention, what we claim as new and desire to secure by Letters Patent is as follows:

1. A method of laser planarizing metallic films consisting essentially of the steps of:

forming a metallic film under zone 1 deposition conditions by depositing a metallic film on a substrate at a working gas pressure sufficiently high to produce a metallic film having a columnar morphology and a textured surface on the film, the textured film having a lower optical reflectivity and higher absorption of laser radiation of a range of wavelengths than said metallic film as formed with a smooth surface under other than zone 1 deposition conditions; and heating the textured film by means of laser radiation of said range of wavelengths to melt the film, whereby a lower minimum fluence of the laser radiation is required to melt or nearly melt the film than required for said smooth metallic film.

2. The method of laser planarizing metallic films recited in claim 1 wherein the textured film is deposited at a pressure between 10 and 100 mTorr.

3. The method of laser planarizing metallic films recited in claim 2 wherein the textured film is deposited at a deposition temperature which is lower than the melting temperature of the film.

4. The method of laser planarizing metallic films recited in claim 3 wherein the ratio of the deposition temperature, T, to the melting temperature, $T_m$, is less than 0.3.

5. The method of laser planarizing metallic films recited in claim 1 wherein the metal deposited is selected from the group consisting of aluminum, copper, alloys of aluminum and copper, silver, and gold.

6. The method of laser planarizing metallic films recited in claim 5 wherein the textured film is deposited at a pressure between 10 and 100 mTorr.

7. The method of laser planarizing metallic films recited in claim 6 wherein the textured film is deposited at a deposition temperature which is lower than the melting temperature of the film.

8. The method of laser planarizing metallic films recited in claim 7 wherein the ratio of the deposition temperature, T, to the melting temperature, $T_m$, is less than 0.3.

9. The method of laser planarizing metallic films recited in claim 1 wherein the metal deposited comprises aluminum.

* * * * *